United States Patent
Fu

(10) Patent No.: US 10,074,337 B2
(45) Date of Patent: Sep. 11, 2018

(54) CHAMFERING CIRCUIT OF ADJUSTABLE CHAMFERED WAVEFORM AND ADJUST METHOD OF CHAMFERED WAVEFORM

(71) Applicant: Shenzhen China Star Optoelectronics Technology Co., Ltd., Shenzhen (CN)

(72) Inventor: Wei Fu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 189 days.

(21) Appl. No.: 15/122,636

(22) PCT Filed: Apr. 14, 2016

(86) PCT No.: PCT/CN2016/079230
§ 371 (c)(1),
(2) Date: Aug. 30, 2016

(87) PCT Pub. No.: WO2017/156817
PCT Pub. Date: Sep. 21, 2017

(65) Prior Publication Data
US 2018/0114501 A1    Apr. 26, 2018

(30) Foreign Application Priority Data
Mar. 16, 2016  (CN) .......................... 2016 1 0150231

(51) Int. Cl.
*G09G 3/36* (2006.01)
*H03K 5/08* (2006.01)

(52) U.S. Cl.
CPC .......... *G09G 3/3696* (2013.01); *G09G 3/3648* (2013.01); *H03K 5/082* (2013.01); *G09G 2310/06* (2013.01)

(58) Field of Classification Search
CPC ..... G09G 3/3696; G09G 3/3648; H03K 5/082
See application file for complete search history.

(56) References Cited

U.S. PATENT DOCUMENTS

| | | | |
|---|---|---|---|
| 6,359,607 B1* | 3/2002 | Yanagi ................. | G09G 3/3648 345/204 |
| 2003/0089965 A1* | 5/2003 | Haneda ............... | H01L 29/0821 257/557 |
| 2005/0062706 A1* | 3/2005 | Mizumaki ........... | G09G 3/3648 345/94 |
| 2008/0100227 A1* | 5/2008 | Iwabuchi ............. | G09G 3/3266 315/169.3 |
| 2010/0194735 A1* | 8/2010 | Ohtsubo .............. | G09G 3/3666 345/211 |

* cited by examiner

*Primary Examiner* — Kevin M Nguyen
(74) *Attorney, Agent, or Firm* — Leong C. Lei

(57) ABSTRACT

The present invention provides a chamfering circuit of adjustable chamfered waveform and an adjust method of a chamfered waveform. The chamfering circuit of adjustable chamfered waveform according to the present invention comprises a digital power source IC (1), a first resistor (R1), a second resistor (R2) and a triode (Tr1); wherein the chamfered waveform can be adjusted by adjusting the triode base voltage (VB) outputted by the digital power source IC (1) to promote the image quality. In comparison with prior art, welding the resistor is not required to accomplish the adjustment of the chamfered waveform. The operation is simple and the work efficiency is high.

12 Claims, 6 Drawing Sheets step 1, providing a chamfering circuit, comprising: a digital power source IC (1), a first resistor (R1), a second resistor (R2) and a triode (Tr1); wherein
the digital power source IC (1) comprises: a TFT activation voltage output terminal (11) and a triode base voltage output terminal (12); one end of the first resistor (R1) is electrically coupled to the TFT activation voltage output terminal (11) of the digital power source IC (1), and the other end is electrically coupled to an emitter e of the triode (Tr1); a base (b) of the triode (Tr1) is electrically coupled to the triode base voltage output terminal (12) of the digital power source IC (1), and the emitter (e) is electrically one end of the second resistor (R2), and a collector (c) is grounded; one end of the second resistor (R2) is electrically coupled to the other end of the first resistor (R1), and the other end is grounded;

― 1 step 2, adjusting the base voltage (VB) outputted by the triode base voltage output terminal (12) of the digital power source IC (1) to control an on duration of the triode (Tr1) to change a chamfered waveform of the TFT activation voltage (VGH).

CHAMFERING CIRCUIT OF ADJUSTABLE CHAMFERED WAVEFORM AND ADJUST METHOD OF CHAMFERED WAVEFORM

FIELD OF THE INVENTION

The present invention relates to a display technology field, and more particularly to a chamfering circuit of adjustable chamfered waveform and an adjust method of a chamfered waveform.

BACKGROUND OF THE INVENTION

The LCD (Liquid Crystal Display) possesses many advantages of being ultra thin, power saved and radiation free. It has been widely utilized in, such as LCD TVs, mobile phones, Personal Digital Assistant (PDA), digital cameras, laptop screens or notebook screens, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

The TFT array substrate comprises a plurality of gate lines and a plurality of data lines. The plurality of gate lines and the plurality of data lines, which are orthogonal with each other, form a plurality of pixel units, and each pixel unit comprises a Thin Film Transistor (TFT), a pixel electrode and a storage capacitor. The TFT comprises a gate coupled to the gate line, a source coupled to the data line, and a drain coupled to the pixel electrode. When the gate lines is driven, the TFT is in an on state, the gray scale voltage signal is sent to the corresponding data line and loaded to the pixel electrode thereby. Thus, the corresponding electrical field generates between the pixel electrode and the common electrode. The liquid crystal molecules in the liquid crystal layer has orientation change under the function of the electrical field, and thus to realize the image display.

In the liquid crystal display device according to prior art, with the influence of the capacitance coupling effect, as the TFT is activated and deactivated, the stability of the data signal voltage will be influenced, and then, the image quality is affected. Therefore, it is required to chamfer the TFT activation voltage VGH to reduce the voltage difference between the TFT activation voltage VGH and the TFT deactivation voltage VGL as the TFT is deactivated to diminish the influence to the data signal voltage. Specifically, referring to FIG. 1, the method of grounding and discharging the resistor is commonly used in prior art to achieve the objective of chamfer. As shown in FIG. 1, the chamfering circuit according to prior art comprises: an Integrated Circuit (IC) 10 and a chamfering circuit 20; one end of the chamfering circuit 20 is coupled to the Integrated Circuit 10, and the other end is grounded; referring to FIG. 2, the TFT activation voltage VGH generated by the Integrated Circuit 10 is discharged and chamfered with the chamfering resistor 20. For the chamfering resistor 20 of the same resistance, the chamfered waveform formed by the TFT activation voltage VGH is the same. Because the chamfered waveform will influence the pixel charge time to result in the H-block (Horizontal Block) phenomenon. Thus, it is required to control the chamfered waveform of the TFT activation voltage VGH to reduce the influence to the pixel charge time and to prevent the H-block phenomenon. Accordingly, it needs to replace the chamfering resistor 20 to find out the best resistance which has the smallest influence to the pixel charge time. The operation of such method is complicated and the work efficiency is low.

SUMMARY OF THE INVENTION

An objective of the present invention is to provide a chamfering circuit of adjustable chamfered waveform, which can conveniently and quickly adjust the chamfered waveform to promote the work efficiency and to improve the image quality.

Another objective of the present invention is to further provide an adjust method of a chamfered waveform, which can conveniently and quickly adjust the chamfered waveform to promote the work efficiency and to improve the image quality.

For realizing the aforesaid objective, the present invention provides a chamfering circuit of adjustable chamfered waveform, comprising: a digital power source IC, a first resistor, a second resistor and a triode; wherein the digital power source IC comprises: a TFT activation voltage output terminal and a triode base voltage output terminal;

one end of the first resistor is electrically coupled to the TFT activation voltage output terminal of the digital power source IC, and the other end is electrically coupled to an emitter of the triode;

a base of the triode is electrically coupled to the triode base voltage output terminal of the digital power source IC, and the emitter is electrically coupled to one end of the second resistor, and a collector is grounded;

one end of the second resistor is electrically coupled to the other end of the first resistor, and the other end is grounded;

the TFT activation voltage output terminal outputs a TFT activation voltage, and the triode base voltage output terminal outputs a triode base voltage, and the triode base voltage is an adjustable voltage.

A chamfered waveform of the TFT activation voltage is adjusted by adjusting the triode base voltage.

In a process of chamfering the TFT activation voltage, as a triode emitter voltage is smaller than the triode base voltage, the triode is on, and a resistance of chamfering resistor is a resistance of the first resistor.

In a process of chamfering the TFT activation voltage, as a triode emitter voltage is larger than the triode base voltage, the triode is off, and a resistance of chamfering resistor is a sum of the resistances of the first resistor and the second resistor.

The digital power source IC is provided with an I2C port, and the triode base voltage outputted by the triode base voltage output terminal is adjusted with the I2C port.

The present invention further provides an adjust method of a chamfered waveform, comprising steps of:

step 1, providing a chamfering circuit, comprising: a digital power source IC, a first resistor, a second resistor and a triode; wherein the digital power source IC comprises: a TFT activation voltage output terminal and a triode base voltage output terminal; one end of the first resistor is electrically coupled to the TFT activation voltage output terminal of the digital power source IC, and the other end is electrically coupled to an emitter of the triode; a base of the triode is electrically coupled to the triode base voltage output terminal of the digital power source IC, and the emitter is electrically coupled to one end of the second resistor, and a collector is grounded; one end of the second resistor is electrically coupled to the other end of the first resistor, and the other end is grounded;

step 2, adjusting the base voltage outputted by the triode base voltage output terminal of the digital power source IC to control an on duration of the triode to change a chamfered waveform of the TFT activation voltage.

In a process of chamfering the TFT activation voltage of the chamfering circuit provided in the step 1, as a triode emitter voltage is smaller than the triode base voltage, the triode is on, and a resistance of chamfering resistor is a resistance of the first resistor.

In a process of chamfering the TFT activation voltage of the chamfering circuit provided in the step 1, as a triode emitter voltage is larger than the triode base voltage, the triode is off, and a resistance of chamfering resistor is a sum of the resistances of the first resistor and the second resistor.

In the step 2, the triode base voltage outputted by the triode base voltage output terminal of the digital power source IC is adjusted with the I2C port.

The present invention further provides a chamfering circuit of adjustable chamfered waveform, comprising: a digital power source IC, a first resistor, a second resistor and a triode; wherein the digital power source IC comprises: a TFT activation voltage output terminal and a triode base voltage output terminal;

one end of the first resistor is electrically coupled to the TFT activation voltage output terminal of the digital power source IC, and the other end is electrically coupled to an emitter of the triode;

a base of the triode is electrically coupled to the triode base voltage output terminal of the digital power source IC, and the emitter is electrically coupled to one end of the second resistor, and a collector is grounded;

one end of the second resistor is electrically coupled to the other end of the first resistor, and the other end is grounded;

the TFT activation voltage output terminal outputs a TFT activation voltage, and the triode base voltage output terminal outputs a triode base voltage, and the triode base voltage is an adjustable voltage;

wherein a chamfered waveform of the TFT activation voltage is adjusted by adjusting the triode base voltage;

wherein the digital power source IC is provided with an I2C port, and the triode base voltage outputted by the triode base voltage output terminal is adjusted with the I2C port.

The benefits of the present invention are: the present invention provides a chamfering circuit of adjustable chamfered waveform, comprising a digital power source IC, a first resistor, a second resistor and a triode; wherein the chamfered waveform can be adjusted by adjusting the triode base voltage outputted by the digital power source IC to promote the image quality. In comparison with prior art, welding the resistor is not required to accomplish the adjustment of the chamfered waveform. The operation is simple and the work efficiency is high. The present invention further provides an adjust method of a chamfered waveform, which can conveniently and quickly adjust the chamfered waveform to promote the work efficiency and to improve the image quality.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings,

FIG. 6 is a flowchart of an adjust method of a chamfered waveform according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
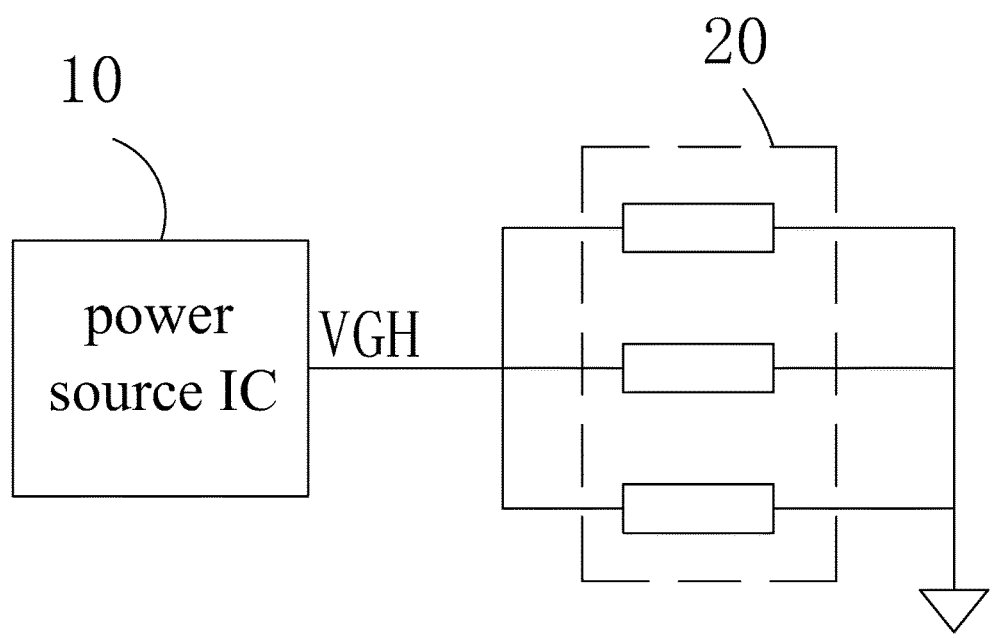
FIG. 1 is a circuit diagram of a chamfering circuit according to prior art.
Figure 2:
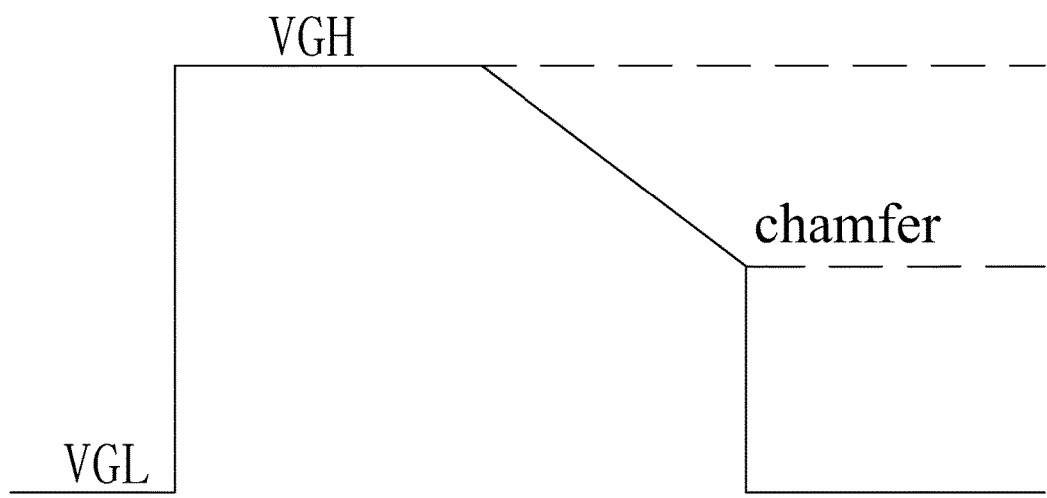
FIG. 2 is a chamfered waveform of the circuit shown in FIG. 1.
Figure 3:
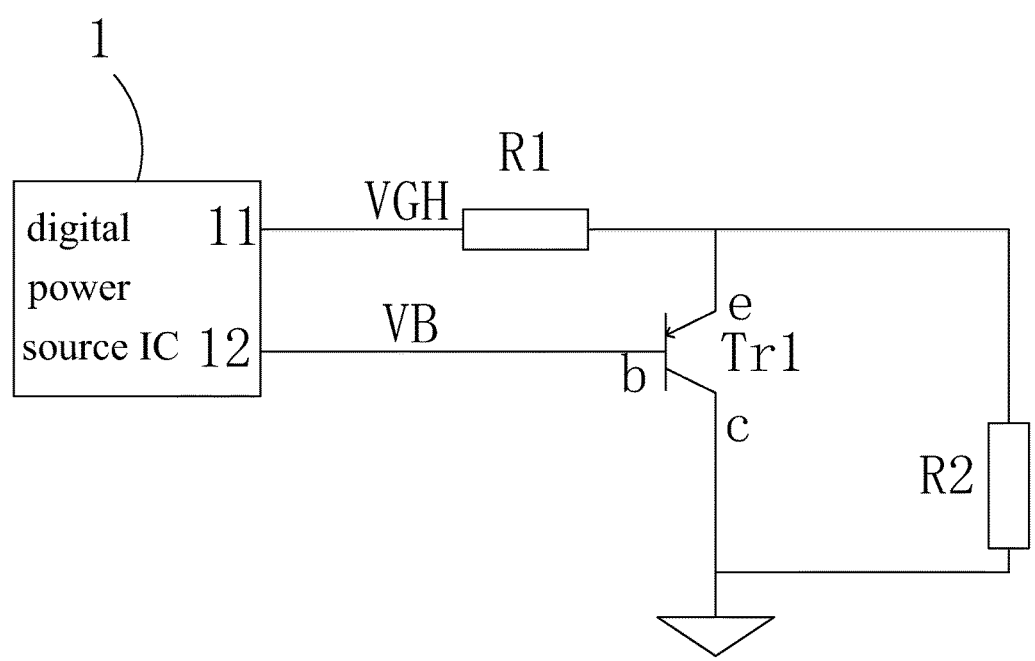
FIG. 3 is a circuit diagram of a chamfering circuit of adjustable chamfered waveform according to the present invention.

Please refer to FIG. 3. The present invention provides a chamfering circuit of adjustable chamfered waveform, comprising: a digital power source IC 1, a first resistor R1, a second resistor R2 and a triode Tr1; wherein the digital power source IC 1 comprises: a TFT activation voltage output terminal 11 and a triode base voltage output terminal 12;

one end of the first resistor R1 is electrically coupled to the TFT activation voltage output terminal 11 of the digital power source IC 1, and the other end is electrically coupled to an emitter e of the triode Tr1;

a base b of the triode Tr1 is electrically coupled to the triode base voltage output terminal 12 of the digital power source IC 1, and the emitter e is electrically coupled to one end of the second resistor R2, and a collector c is grounded;

one end of the second resistor R2 is electrically coupled to the other end of the first resistor R1, and the other end is grounded;

the TFT activation voltage output terminal 11 outputs a TFT activation voltage VGH, and the triode base voltage output terminal 12 outputs a triode base voltage VB, and the triode base voltage VB is an adjustable voltage.

Figure 4:
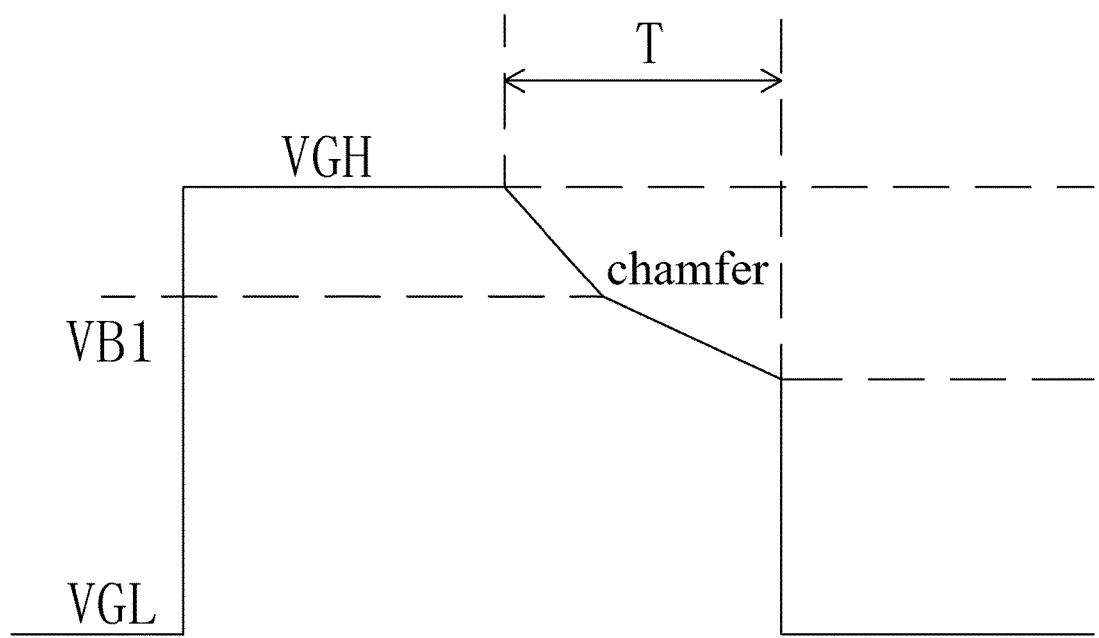
FIG. 4 is a chamfered waveform diagram as the triode base voltage in the chamfering circuit of adjustable chamfered waveform according to the present invention is VB1.
Figure 5:
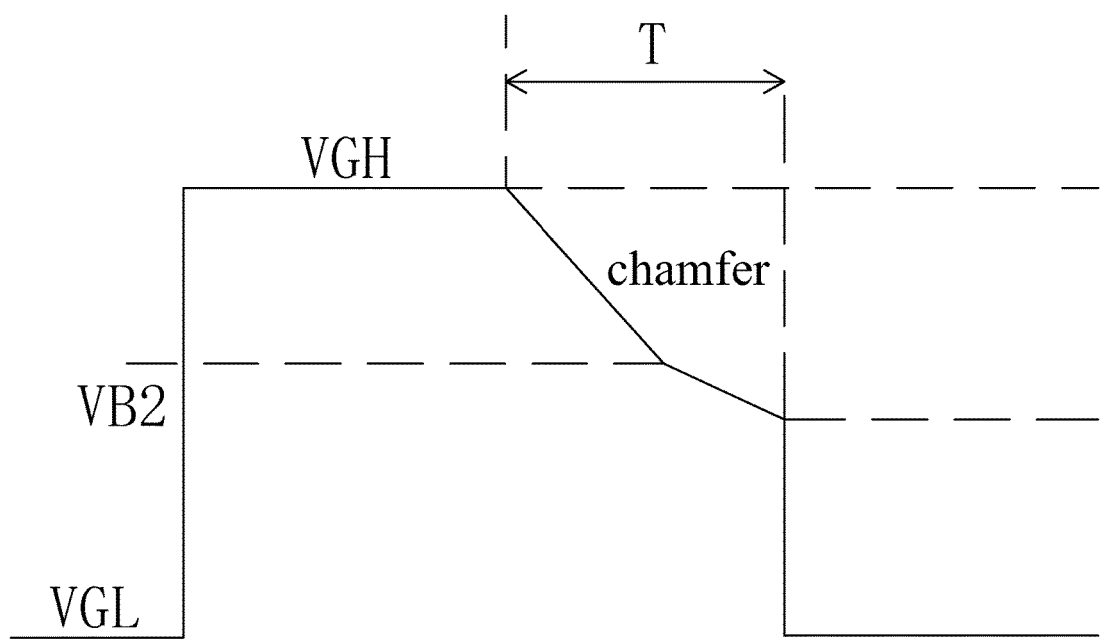
FIG. 5 is a chamfered waveform diagram as the triode base voltage in the chamfering circuit of adjustable chamfered waveform according to the present invention is VB2.

Specifically, referring to FIG. 4 and FIG. 5, as starting chamfering the TFT activation voltage VGH, a triode emitter voltage is smaller than the triode base voltage VB, and then the triode Tr1 is on, and a resistance of chamfering resistor is a resistance of the first resistor R1. The TFT activation voltage VGH is grounded and discharged through the first resistor R1 and the triode Tr1. The discharge rate is faster and the chamfered waveform is steeper. As the triode emitter voltage is discharged to be equal to the triode base voltage VB, the triode Tr1 is off, and a resistance of chamfering resistor is a sum of the resistances of the first resistor R1 and the second resistor R2. The discharge rate is slower and the chamfered waveform is gentler. For instance, as determining that the triode base voltage VB is 10V, the TFT activation voltage VGH will be discharged to be 10V with the faster rate through the path of the first resistor R1 and the triode Tr1, and then keeps to be discharged from 10V with the slower rate through the path of the first resistor R1 and the second resistor R2. Namely, the smaller the triode base voltage VB is, the longer the conduction duration of the triode Tr1 is. The chamfered waveform of the TFT activation voltage VGH is steeper and the discharge rate is faster. Thus, the triode base voltage VB outputted by the triode base voltage output terminal 12 of the digital power source IC 1 can be adjusted with the I2C port. As the triode Tr1 is on, the chamfered waveform is changed to control the discharge rate of the TFT activation voltage VGH. For instance, as shown in FIG. 4 and FIG. 5, which are chamfered waveforms with two different triode base voltages, wherein VB1 is larger than VB2. The discharge rate of the TFT activation voltage VGH in FIG. 4 is slower than the discharge rate of the TFT activation voltage VGH in FIG. 5, and the discharge volume in the same duration T is lower than that in FIG. 5, and the lowest point of the TFT activation voltage VGH after discharge is higher than the lowest point of the TFT activation voltage VGH after discharge in FIG. 5.

Please refer to FIG. 6. The present invention further provides an adjust method of a chamfered waveform, comprising steps of:

step 1, referring to FIG. 3, providing a chamfering circuit, comprising: a digital power source IC 1, a first resistor R1, a second resistor R2 and a triode Tr1; wherein the digital power source IC 1 comprises: a TFT activation voltage output terminal 11 and a triode base voltage output terminal 12;

one end of the first resistor R1 is electrically coupled to the TFT activation voltage output terminal 11 of the digital power source IC 1, and the other end is electrically coupled to an emitter e of the triode Tr1;

a base b of the triode Tr1 is electrically coupled to the triode base voltage output terminal 12 of the digital power source IC 1, and the emitter e is electrically coupled to one end of the second resistor R2, and a collector c is grounded;

one end of the second resistor R2 is electrically coupled to the other end of the first resistor R1, and the other end is grounded;

step 2, adjusting the base voltage VB outputted by the triode base voltage output terminal 12 of the digital power source IC 1 to control an on duration of the triode Tr1 to change a chamfered waveform of the TFT activation voltage VGH.

Specifically, in a process of chamfering the TFT activation voltage of the chamfering circuit provided in the step 1, as a triode emitter voltage is smaller than the triode base voltage VB, the triode Tr1 is on, and a resistance of chamfering resistor is a resistance of the first resistor R1; as a triode emitter voltage is larger than the triode base voltage, the triode Tr1 is off, and a resistance of chamfering resistor is a sum of the resistances of the first resistor R1 and the second resistor R2. For instance, as shown in FIG. 4 and FIG. 5, which are chamfered waveforms with two different triode base voltages, wherein VB1 is larger than VB2. The discharge rate of the TFT activation voltage VGH in FIG. 4 is slower than the discharge rate of the TFT activation voltage VGH in FIG. 5, and the discharge volume in the same duration T is lower than that in FIG. 5, and the lowest point of the TFT activation voltage VGH after discharge is higher than the lowest point of the TFT activation voltage VGH after discharge in FIG. 5.

Furthermore, in the step 2, the triode base voltage VB outputted by the triode base voltage output terminal 12 of the digital power source IC 1 is adjusted with the I2C port, and the operation is simple and convenient.

In conclusion, the present invention provides a chamfering circuit of adjustable chamfered waveform, comprising a digital power source IC, a first resistor, a second resistor and a triode; wherein the chamfered waveform can be adjusted by adjusting the triode base voltage outputted by the digital power source IC to promote the image quality. In comparison with prior art, welding the resistor is not required to accomplish the adjustment of the chamfered waveform. The operation is simple and the work efficiency is high. The present invention further provides an adjust method of a chamfered waveform, which can conveniently and quickly adjust the chamfered waveform to promote the work efficiency and to improve the image quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A chamfering circuit of adjustable chamfered waveform, comprising: a digital power source IC, a first resistor, a second resistor and a triode; wherein the digital power source IC comprises: a TFT activation voltage output terminal and a triode base voltage output terminal;

one end of the first resistor is electrically coupled to the TFT activation voltage output terminal of the digital power source IC, and the other end is electrically coupled to an emitter of the triode;

a base of the triode is electrically coupled to the triode base voltage output terminal of the digital power source IC, and the emitter is electrically coupled to one end of the second resistor, and a collector is grounded;

one end of the second resistor is electrically coupled to the other end of the first resistor, and the other end is grounded;

the TFT activation voltage output terminal outputs a TFT activation voltage, and the triode base voltage output terminal outputs a triode base voltage, and the triode base voltage is an adjustable voltage.

2. The chamfering circuit of adjustable chamfered waveform according to claim 1, wherein a chamfered waveform of the TFT activation voltage is adjusted by adjusting the triode base voltage.

3. The chamfering circuit of adjustable chamfered waveform according to claim 2, wherein in a process of chamfering the TFT activation voltage, as a triode emitter voltage is smaller than the triode base voltage, the triode is on, and a resistance of chamfering resistor is a resistance of the first resistor.

4. The chamfering circuit of adjustable chamfered waveform according to claim 2, wherein in a process of chamfering the TFT activation voltage, as a triode emitter voltage is larger than the triode base voltage, the triode is off, and a resistance of chamfering resistor is a sum of the resistances of the first resistor and the second resistor.

5. The chamfering circuit of adjustable chamfered waveform according to claim 1, wherein the digital power source IC is provided with an I2C port, and the triode base voltage outputted by the triode base voltage output terminal is adjusted with the I2C port.

6. An adjust method of a chamfered waveform, comprising steps of:

step 1, providing a chamfering circuit, comprising: a digital power source IC, a first resistor, a second resistor and a triode; wherein the digital power source IC comprises: a TFT activation voltage output terminal and a triode base voltage output terminal; one end of the first resistor is electrically coupled to the TFT activation voltage output terminal of the digital power source IC, and the other end is electrically coupled to an emitter of the triode; a base of the triode is electrically coupled to the triode base voltage output terminal of the digital power source IC, and the emitter is electrically coupled to one end of the second resistor, and a collector is grounded; one end of the second resistor is electrically coupled to the other end of the first resistor, and the other end is grounded;

step 2, adjusting the base voltage outputted by the triode base voltage output terminal of the digital power source IC to control an on duration of the triode to change a chamfered waveform of the TFT activation voltage.

7. The adjust method of the chamfered waveform according to claim 6, wherein in a process of chamfering the TFT activation voltage of the chamfering circuit provided in the step 1, as a triode emitter voltage is smaller than the triode base voltage, the triode is on, and a resistance of chamfering resistor is a resistance of the first resistor.

8. The adjust method of the chamfered waveform according to claim 6, wherein in a process of chamfering the TFT activation voltage of the chamfering circuit provided in the step 1, as a triode emitter voltage is larger than the triode base voltage, the triode is off, and a resistance of chamfering resistor is a sum of the resistances of the first resistor and the second resistor.

9. The adjust method of the chamfered waveform according to claim 6, wherein in the step 2, the triode base voltage outputted by the triode base voltage output terminal of the digital power source IC is adjusted with the I2C port.

10. A chamfering circuit of adjustable chamfered waveform, comprising: a digital power source IC, a first resistor, a second resistor and a triode; wherein the digital power source IC comprises: a TFT activation voltage output terminal and a triode base voltage output terminal;

one end of the first resistor is electrically coupled to the TFT activation voltage output terminal of the digital power source IC, and the other end is electrically coupled to an emitter of the triode;

a base of the triode is electrically coupled to the triode base voltage output terminal of the digital power source IC, and the emitter is electrically coupled to one end of the second resistor, and a collector is grounded;

one end of the second resistor is electrically coupled to the other end of the first resistor, and the other end is grounded;

the TFT activation voltage output terminal outputs a TFT activation voltage, and the triode base voltage output terminal outputs a triode base voltage, and the triode base voltage is an adjustable voltage;

wherein a chamfered waveform of the TFT activation voltage is adjusted by adjusting the triode base voltage;

wherein the digital power source IC is provided with an I2C port, and the triode base voltage outputted by the triode base voltage output terminal is adjusted with the I2C port.

11. The chamfering circuit of adjustable chamfered waveform according to claim 10, wherein in a process of chamfering the TFT activation voltage, as a triode emitter voltage is smaller than the triode base voltage, the triode is on, and a resistance of chamfering resistor is a resistance of the first resistor.

12. The chamfering circuit of adjustable chamfered waveform according to claim 10, wherein in a process of chamfering the TFT activation voltage, as a triode emitter voltage is larger than the triode base voltage, the triode is off, and a resistance of chamfering resistor is a sum of the resistances of the first resistor and the second resistor.

\* \* \* \* \*